United States Patent [19]

Goff et al.

[11] 4,414,312

[45] * Nov. 8, 1983

[54] PHOTOPOLYMERIZABLE POLYAMIDE ESTER RESIN COMPOSITIONS CONTAINING AN OXYGEN SCAVENGER

[75] Inventors: David L. Goff, Springfield; Edward L. Yuan, Philadelphia, both of Pa.; Stephen Proskow, Wilmington, Del.

[73] Assignee: E. I. Du Pont de Nemours & Co., Wilmington, Del.

[ * ] Notice: The portion of the term of this patent subsequent to May 11, 1999 has been disclaimed.

[21] Appl. No.: 334,164

[22] Filed: Dec. 24, 1981

Related U.S. Application Data

[63] Continuation-in-part of Ser. No. 183,648, Sep. 3, 1980, Pat. No. 4,329,419.

[51] Int. Cl.[3] .......... G03C 1/68

[52] U.S. Cl. .......... 430/283; 204/159.19; 204/159.18; 430/285; 430/288

[58] Field of Search .......... 430/283, 485, 288; 204/159.18, 159.19

[56] References Cited

U.S. PATENT DOCUMENTS

| | | | |
|---|---|---|---|
| 3,380,831 | 4/1968 | Cohen . | |
| 3,479,185 | 11/1969 | Chambers . | |
| 3,552,973 | 1/1971 | Fishman . | |
| 3,594,410 | 7/1971 | Cohen . | |
| 3,623,870 | 11/1971 | Curran . | |
| 3,784,557 | 1/1974 | Cescon . | |
| 3,953,877 | 4/1976 | Sigusch et al. . | |
| 3,957,512 | 5/1976 | Kleeberg et al. . | |
| 4,040,831 | 8/1977 | Rubner et al. . | |
| 4,093,461 | 6/1971 | Loprest et al. . | |
| 4,117,196 | 9/1973 | Mathias . | |
| 4,132,812 | 1/1979 | Mathias . | |
| 4,188,224 | 2/1980 | Felder et al. . | |
| 4,291,115 | 9/1981 | Chambers | 430/271 |
| 4,329,419 | 5/1982 | Goff et al. | 430/283 |

*Primary Examiner*—Jack P. Brammer
*Attorney, Agent, or Firm*—Hilmar L. Fricke

[57] ABSTRACT

A polymeric heat resistant photopolymerizable composition of a polyamide ester resin containing photopolymerizable groups useful for forming relief structures on electrical devices such as capacitors, integrated circuits, printed circuits and semiconductors; a solution of the composition is applied to a substrate such as a coated silicon wafer which is the base for an electrical device, dried to form a film, the film is exposed to radiation through a pattern and photopolymerized; the unexposed and unpolymerized part of the film is dissolved off and the resulting relief structure is converted to a polyimide structure with sharp definition and has good mechanical, chemical and electrical properties; to reduce radiation exposure time and increase the rate of photopolymerization the following constituents are used in the composition:

radiation sensitive polymerizable polyfunctional acrylate compound and photopolymerization initiators containing hydrogen donor initiator and aromatic biimidazole, and an oxygen scavenger.

11 Claims, No Drawings

PHOTOPOLYMERIZABLE POLYAMIDE ESTER RESIN COMPOSITIONS CONTAINING AN OXYGEN SCAVENGER

CROSS REFERENCE TO RELATED APPLICATIONS

This application is a continuation-in-part application of Ser. No. 183,648 filed Sept. 3, 1980 now U.S. Pat. No. 4,329,419 issued May 11, 1982.

BACKGROUND OF THE INVENTION

This invention relates to an improved polymeric heat resistant photopolymerizable composition useful for forming relief structures on electrical devices such as semiconductors, capacitors or printed circuits.

Photopolymerizable polymeric compositions used to form relief structures on electrical devices are well known as shown in Sigusch et al. U.S. Pat. No. 3,953,877 issued Apr. 27, 1976, Kleeberg et al. U.S. Pat. No. 3,957,512 issued May 18, 1976 and Rubner et al. U.S. Pat. No. 4,040,831 issued Aug. 9, 1977 now U.S. Pat. No. Re. 30,186 reissued Jan. 8, 1980. These compositions have limited commercial use since the radiation exposure time required to photopolymerize these compositions is too long for a modern process. In an efficient contact printing process, exposure times of 1 minute and preferably of 30 seconds or less are needed. The improved composition of this invention provides a composition that can be photopolymerized in a relatively short time period of exposure to radiation.

SUMMARY OF THE INVENTION

An improved radiation polymerizable composition of about (a) 10–50% by weight, based on the weight of the composition, of a polyamide ester resin containing photopolymerizable groups, (b) 50–90% by weight, based on the weight of the composition, of solvent for the resin;

(c) 5–30% by weight, based on the weight of the resin, of radiation sensitive polymerizable polyfunctional acrylate compound and (d) 0.6–20% by weight, based on the weight of the resin, of photopolymerization initiators containing hydrogen donor initiator and aromatic biimidazole; and (e) 0.1–10% by weight, based on the weight of the resin, of an oxygen scavenger.

DESCRIPTION OF THE INVENTION

The improved radiation polymerizable composition is used to form relief structures on electrical devices such as capacitors and semiconductors. A solution of the composition is applied to a substrate such as silicon wafer coated with a silicon dioxide layer and dried and forms a film on the substrate. The film is then exposed to radiation through a pattern and photopolymerized to form a relief structure. The unexposed and unpolymerized part of the film is dissolved off with a developer solution. The resulting relief structure is baked to remove the material not stable to heat and to form a polyimide structure with a sharp definition and with good mechanical, chemical and electrical properties.

To reduce radiation exposure time and increase the rate of photopolymerization of a composition of a polyamide ester resin containing photopolymerizable groups, the following constituents are used in the composition:

about 5–30% by weight, based on the weight of resin, of radiation sensitive polymerizable polyfunctional acrylate compound; about 0.6–20% by weight, based on the weight of the resin, of photopolymerization initiator containing hydrogen donor initiator and aromatic biimidazole and about 0.1–10% by weight, based on the weight of the resin, of an oxygen scavenger.

Typically useful radiation sensitive polymerizable polyfunctional acrylate compounds are as follows: trimethylol propane trimethacrylate, trimethylol propane triacrylate, trimethylol propane ethoxylate trimethacrylate, trimethylol propane ethoxylate triacrylate, trimethylol propane polyethoxylate trimethacrylate, trimethylol propane polyethoxylate triacrylate and mixtures thereof. Preferred are trimethylol propane polyethoxylate triacrylate having a weight average molecular weight of molecular weight of about 500–1500 and trimethylol propane ethoxylate triacrylate, pentaerythritol triacrylate, polyethylene glycol diacrylate, tetra ethylene glycol diacrylate, triethylene glycol diacrylate, diethylene glycol diacrylate, polyethylene glycol dimethacrylate, polymethylene diacrylate, polymethylene dimethacrylate, trimethylene glycol dimethacrylate and mixtures thereof. One preferred acrylate that provides a high quality composition is tetraethylene glycol diacrylate.

The above molecular weight is determined by gel permeation chromatography.

Typical aromatic biimadazole photo-polymerization initiators that are used in the composition are disclosed by Chambers U.S. Pat. No. 3,479,185 issued Nov. 18, 1969 and Cescon U.S. Pat. No. 3,784,557 issued Jan. 8, 1974 which are hereby incorporated by reference. A 2,4,5-triphenyl imidazolyl dimer having an ortho substituent on the 2 phenyl ring is a particularly useful initiator. Typical initiators of this type are 2-o-chlorophenyl-4,5 diphenylimidazolyl dimer, 2-(o-fluorophenyl)-4,5-diphenylimidazolyl dimer, 2-(o-methyoxyphenyl) 4,5-diphenylimidazolyl dimer and mixtures thereof. Particularly preferred are bis(2-o-chlorophenyl-4,5-diphenylimidazolyl) and bis[2-o-chlorophenyl-4,5-di-(m-methoxy phenyl) imidazolyl] since these initiators are stable and are excellent photo polymerization initiators.

Also, hexaaryl biimidazoles can be used as photopolymerization initiators as shown in Fishman U.S. Pat. No. 3,552,973 issued Jan. 5, 1971.

To enhance the photopolymerization, hydrogen donors, photointiators, photosensitizers or mixtures thereof preferably in amounts of about 0.1–10% by weight, based on the weight of the resin, are used in the composition. Typically useful hydrogen donors, photosensitizers and photoinitiators include the following: aromatic ketones such as benzophenone, Michler's ketone [4,4'-bis(dimethylamino)benzophenone], 4,4'-bis(diethylamino)benzophenone, 4-acryloxy-4'-diethylaminobenzophenone, 4-methoxy-4'-dimethylaminobenzophenone, 2-ethylanthraquinone, phenanthraquinone, 2-t-butylanthraquinone, 1,2-benzanthraquinone, 2,3-benzanthraquinone, 2,3-dichloronaphthoquinone, benzil dimethyl ketal, and other aromatic ketones such as disclosed in aforementioned U.S. Pat. No. 3,552,973; benzoin, benzoin ethers such as benzoin methyl ether, benzoin ethyl ether, benzoin isobutyl ether, and benzoin phenyl ether, methylbenzoin, ethylbenzoin and other benzoins.

The composition also contains about 0.1–10% by weight, based on the weight of the resin, of an oxygen scavenger. Typically useful oxygen scavengers are mercaptobenzothiazole, mercaptobenzooxazoles as disclosed in U.S. Pat. No. 4,291,115 n-phenyl glycine, triphenylphosphine and mixtures thereof. Some oxygen scavengers are also hydrogen donors. If such scavengers are used a separate hydrogen donor is not required.

It is preferred to have a compound present in amounts of about 0.1–10% by weight, based on the weight of the resin, that changes color when polymerization is complete and that is a hydrogen donor that provides a rapid start for polymerization Leuco dyes can be used such as those disclosed in aforementioned U.S. Pat. No. 3,552,973 col. 6, line 6 to col. 11, line 9 which disclosure is hereby incorporated by reference. Typically useful dyes are alkyl amino-aromatic alkanes such as tris(diethylamino-o-tolyl) methane, tris(dimethylamino-o-oxylyl) methane and tris(dipropyl amino-o-tolyl) methane.

The photopolymerizable resin used in the composition can be any type of resin that contains olefinic unsaturated groups that are photopolymerizable and that will form a polymer with good thermal, electrical and chemical properties. Polyamide ester resins are particularly useful. These resins are prepared according to the aforementioned Rubner U.S. Pat. No. Re. 30,186 wherein an aromatic polycarboxylic acid anhydride is esterified with a hydroxy alkyl acrylate or methacrylate which is then reacted with diamine. Typical aromatic polycarboxylic acid anhydrides and diamines are disclosed in Edwards U.S. Pat. No. 3,179,614 issued Apr. 20, 1965 which disclosure is hereby incorporated by reference.

Typical hydroxy alkyl acrylates and methacrylates are as follows: hydroxyethyl acrylate, hydroxypropyl acrylate, hydroxy butyl acrylate, hydroxy ethyl methacrylate, hydroxypropyl methacrylate, hydroxybutyl methacrylate and the like.

Typically useful polyamide ester resins have the following structure:

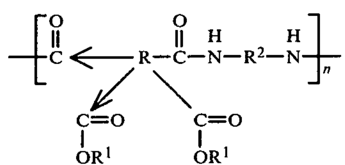

where the → denotes isomerism, R is an aromatic radical, $R^1$ is an organic radical containing a photo polymerizable olefinic double bond, $R^2$ is an aromatic, aliphatic or cycloaliphatic radical and n is a positive integer sufficiently large to provide the resin with a number average molecular weight of about 1500–15,000 determined by vapor pressure osmometry.

One particularly useful polyamide ester resin is the reaction product of pyromellitic dianhydride, hydroxy ethyl methacrylate and oxydianiline having a number average molecular weight of about 1500–6000.

Typical solvents that can be used alone or in combination to dissolve the polymer and to dilute the composition to an application viscosity are N-methylpyrrolidone, butyrolactone, ethylene glycol monoethyl ether, dimethyl formamide, dimethyl acetamide, hexamethylphosphoric acid triamide and dimethyl sulfoxide.

Blends of these solvents with a nonsolvent can be used as a developer solution to remove resin that was not exposed to radiation and not polymerized.

Typical developer solutions are for example 4-butyrolactone, 4-butyrolactone/toluene in a weight ratio of 20/1 or less to 1/4, dimethyl formamide/ethanol in a weight ratio from 20/1 to $\frac{1}{4}$.

Plasticizers can also be added to the composition in amounts of 0.1–10% by weight, based on the weight of the resin. Typical plasticizers are tricresyl phosphate, dioctyl phthalate, dihexyl phthalate, dinonyl phthalate, polyethylene glycol ethers, ethylene glycol dicaprolate.

In the process for applying the composition to substrates, the composition is applied and then dried to form a film at about 30° to 100° C. for about 20 minutes to 5 hours. The film is then exposed through a pattern for about 1 second to 5 minutes. Preferably, for a commercial process exposure times of 1–60 seconds are required and usually an exposure time under 30 seconds is much preferred. Typical radiation sources used are ultraviolet lamps providing a wave length of 250 to 400 nanometers and an intensity of 0.5–60 milliwatts per square centimeter ($mW/cm^2$). After exposure, the film is then dipped or sprayed, with a developer solution and washed with a nonsolvent and then dried. The film is converted to a polyimide relief structure by baking at about 200°–400° C. for about 20 minutes to 4 hours. During conversion, all the acrylate components are decomposed leaving a polyimide structure which is formed. The resulting relief structure has a sharp definition, good chemical, electrical and mechanical properties.

Typical uses for the composition are as follows: protective coatings for semi-conductors, dielectric layers for multilayer integrated circuits, high temperature solder mask, multilayer circuits, a final passivating coating on electrical devices, a photoresist and the like.

The following examples illustrate the invention. All parts and percentages are on a weight bases.

EXAMPLE I

| | Grams |
|---|---|
| Polyamide ester resin (described in Example 1 of U.S. Pat. No. 4,329,419) | 6.00 |
| Bis(2-o-chlorophenyl-4,5-diphenylimidazolyl) | 0.36 |
| Michler's ketone (tetramethyl diaminobenzophenone) | 0.18 |
| Mercaptobenzylthiazole | 0.12 |
| Tetraethylene glycol diacrylate | 0.90 |
| N—methylpyrrolidone | 10.00 |
| Thinner (described in Example 3 of U.S. Pat. No. 4,329,419) | 4.00 |
| Total | 21.56 |

The above constituents are charged into a container and the container is placed on a roller and mixed for about 2 hours and then the resulting composition is filtered through a 1 micrometer filter.

A 2 inch diameter silicon wafer having a silicon dioxide coating is held at 300° C. for 10 minutes, cooled to room temperature and then is coated with an aminosilane adhesion promotor solution by a spin coating technique wherein the wafer is rotated at 3000 rpm for 30 seconds after the adhesion promotor solution is applied. The above prepared composition is reduced as follows:

10 parts composition to 1 part thinner (ethylene glycol monoethyl ether/n-methyl pyrrolidone-1/1 weight ratio) and the reduced composition is applied by the above spin technique using 3000 rpm for 10 seconds. The composition is exposed to an infrared (IR) light during the spin application. The coating of the composition is then dried for 2 hours at 55° C. to provide a film about 12,500 Angstroms thick. The coated wafer is placed in a contact printer having a 200 Watt ultraviolet light source of 356 nanometers (nm) and an intensity of about 5.0 mW/cm$^2$ using a mask with lines spaced 4 microns apart and exposed for 5 seconds. The wafer is then developed by dipping the wafer for 10 seconds in a 1/1 solution of 4-butyrolactone/toluene and then rinsed for 15 seconds with a spray of toluene to remove any unexposed composition. The wafer then is heated and held at 300° C. for 1 hour to provide a polymide relief structure having a clear definition of an electrical circuit about 4,500 Angstroms thick.

We claim:

1. A radiation polymerizable comprising about (a) 10–50% by weight, based on the weight of the composition, of a polyamide ester resin containing photopolymerizable groups, (b) 50–90% by weight, based on the weight of the composition, of solvent for the resin, (c) 5–30% by weight, based on the weight of the resin, of radiation polymerizable polyfunctional acrylate compound and (d) 0.6–20% by weight, based on the weight of the resin, of a blend of polymerization initiators comprising hydrogen donor photointiator and aromatic biimidazole;

(e) 0.1–10% by weigth, based on the weight of the resin, of an oxygen scavenger selected from the group consisting of mercaptobenzothiazole, mercaptobenzooxazole, n-phenyl glycine, triphenyl phosphine or mixtures thereof, wherein the polyamide ester resin upo heating converts to a polyimide resin.

2. The composition of claim 1 in which the polyamide ester resin comprises the following structure:

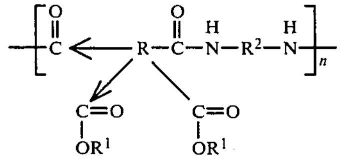

wherein → denotes isomerism, R is an aromatic radical, R$^1$ is an organic radical containing a photopolymerizable olefinic double bond, R$^2$ is an aromatic, aliphatic or cycloaliphatic radical and n is a positive integer sufficiently large to provide the resin with a number average molecular weight of about 1500 to 15,000 determined by vapor pressure osmometry.

3. The composition of claim 2 in which the polyamide ester resin comprises R from pyromellitic dianhydride, R$^1$ from hydroxy alkyl methacrylate or hydroxy alkyl acrylate and R$^2$ from an aromatic diamine.

4. The composition of claim 2 in which the polymerizable polyfunctional acrylate is selected from the group consisting of trimethylol propane trimethacrylate, trimethylol propane triacrylate, trimethylol propane ethoxylate trimethacrylate, trimethylol propane ethoxylate triacrylate, trimethylol propane polyethoxylate trimethacylate, trimethylol propane polyethoxylate triacrylate, pentaerythritol triacrylate, polyethylene glycol diacrylate, tetraethylene glycol diacrylate, triethylene glycol diacrylate, diethylene glycol diacrylate, polyethylene glycol dimethylacrylate, polymethylene diacrylate, polymethylene dimethyacrylate, trimethylene glycol dimethacrylate, and mixtures thereof.

5. The composition of claim 3 or 4 containing about 0.5–15% by weight, based on the weight of the resin, of an aromatic biimidazole.

6. The composition of claim 5 in which the aromatic biimidazole is bis(2-o-chlorophenyl-4,5-diphenyl imidazolyl) or bis[2-o-chloro-phenyl-4,5-di(m-methoxyphenyl) imidazolyl].

7. The composition of claim 5 containing about 0.1–10% by weight, based on the weight of the resin, of a hydrogen donor initiator of an aromatic ketone.

8. The composition of claim 7 in which the aromatic ketone is tetramethyldiaminobenzophenone.

9. The composition of claim 1, 5 or 7 containing in addition to the photopolymerization initiators about 0.1–10% by weight based on the weight of the resin, of a leuco dye.

10. The composition of claim 9 in which the leuco dye is an alkyl amino-aromatic alkane.

11. The composition of claim 2 in which the polyamide ester is of pyromellitic dianhydride esterified with hydroxyethylmethacrylate and reacted with oxydianiline, the polyfunctional acrylateis tetraethylene glycol diacrylate, the aromatic biimidazole is bis(2-o-chlorophenyl-4,5-diphenylimidazolyl), the hydrogen donor photoinitiator is tetramethyldiaminobenzophenone and the composition contains about 0.1–10% by weight, based on the weight of the resin, of mercaptobenzylthiazole.

* * * * *